United States Patent [19]

Lee

[11] Patent Number: 5,004,938

[45] Date of Patent: Apr. 2, 1991

[54] MOS ANALOG NOR AMPLIFIER AND CURRENT SOURCE THEREFOR

[75] Inventor: Sheau-Jiung Lee, Taipei, China

[73] Assignee: Acer Incorporated, Taipei, Taiwan

[21] Appl. No.: 318,383

[22] Filed: Mar. 3, 1989

[51] Int. Cl.$^5$ .......................................... H03K 19/003
[52] U.S. Cl. .................................... 307/448; 307/451; 323/316
[58] Field of Search ............... 307/446, 448, 451, 455; 323/313, 315, 316

[56] References Cited

U.S. PATENT DOCUMENTS

| | | | |
|---|---|---|---|
| 4,270,081 | 5/1981 | Hareyama | 323/316 |
| 4,410,815 | 10/1983 | Ransom et al. | 307/475 |
| 4,651,083 | 3/1987 | Lachmann et al. | 323/316 |
| 4,661,725 | 4/1987 | Chantepie | 307/450 |
| 4,678,942 | 7/1987 | Kanai et al. | 307/455 |
| 4,717,869 | 1/1988 | Koch et al. | 323/316 |
| 4,771,190 | 9/1989 | Umeki | 307/455 |
| 4,798,978 | 1/1989 | Lee et al. | 307/450 |
| 4,808,851 | 2/1989 | Chantepie | 307/450 |
| 4,808,907 | 2/1989 | Main | 323/316 |
| 4,868,482 | 9/1989 | O'Shaughnessy et al. | 323/315 |
| 4,871,931 | 10/1989 | Fitzpatrick et al. | 307/443 |

FOREIGN PATENT DOCUMENTS

| | | | |
|---|---|---|---|
| 0073138 | 6/1980 | Japan | 307/455 |
| 0217721 | 9/1987 | Japan | 307/448 |
| 0097010 | 4/1988 | Japan | 307/448 |
| 0280515 | 11/1988 | Japan | 307/448 |

Primary Examiner—Stanley D. Miller
Assistant Examiner—T. Cunningham
Attorney, Agent, or Firm—Townsend and Townsend

[57] ABSTRACT

A MOS (preferably CMOS type) analog NOR amplifier suitable for use in building a programmable array logic (PAL) or the like, or for other usuages. The analog NOR amplifier consists of a reference MOS transistor and first pull-up means at one branch and a plurality of input MOS transistors and second pull-up means at another branch with a constant current source connected to the source terminals of these MOS transistors, which forms a configuration similar to a differential amplifier. With the gate terminals of the plurality of input MOS transistors as logic input ends, the drain terminals of the same will act as the output end of a standard NOR gate and the drain terminal of the reference MOS transistor will behave as the output end of a standard OR gate. On account of the differential amplifier structure, the MOS analog NOR amplifier will not generate current spikes when in logic transient transition and the amplifier gain can be kept low thereby acquiring a low output impedance to further improve the logic transient response. Furthermore, a constant current source is provided to be utilized in the MOS analog NOR amplifier, whereby the Miller capacitance of the amplifier will be maintained at almost zero so that a high speed but costeffective NOR gate is achievable.

10 Claims, 3 Drawing Sheets

MOS ANALOG NOR AMPLIFIER AND CURRENT SOURCE THEREFOR

BACKGROUND OF THE INVENTION

1. Field of the Invention

The present invention relates to a MOS analog NOR amplifier, and particularly relates to a CMOS analog NOR amplifier which employs CMOS analog amplifier technique to perform digital operations for use in building a programmable array logic (PAL) or other usages.

2. Description the Prior Art

The high speed programmable array logic (PAL) has been a key integrated circuit in building high speed digital systems such as supermini and supermicro computers. The requirement of access time for these high speed PALs is usually less than 15 ns (nanoseconds). Because of this requirement, commercially available high speed PALs are typically fabricated by advanced bipolar technology. Bipolar technology, however, is much more complicated and expensive than CMOS technology, but CMOS technology generally can not offer very high performance characteristics as those from bipolar technology, i.e., PALs constructed using CMOS technology have a much greater access time than those using bipolar technology.

A conventional CMOS NOR gate which may be used to build a PAL is illustrated in FIG. 1. As shown, there are two NMOS transistors connected in parallel forming NMOS drivers and two PMOS transistors attached in series constituting PMOS loads. With either terminal A or B at logic 1 the output terminal Y is at ground. No path is permissible between the output terminal and the power supply $V_{DD}$. In case that the input terminals A and B are at logic 0, both NMOS transistors are closed and both PMOS transistors are opened, thus rendering the output terminal Y a logic 1.

In addition to the speed problem, the conventional CMOS NOR gate also has another drawback called "power bouncing problem". When the input terminal A is at logic 1 and input terminal B at logic 0, the output terminal Y is at logic 0. Then, if the input terminal A shift from logic 1 to logic 0, arises in that during the shifting of the status of input and output terminals, there will be an instant when all the NMOS and PMOS transistors are conducting and thus a current spike flowing from the $V_{DD}$ power supply to the ground produced. Similarly, when the output terminal Y shifts from logic 1 to logic 0, there will also be an similar current spike occurring but in reverse direction. These current spikes, because of the natural inductance within the logic circuits, produce noise voltage in the CMOS NOR gate, thus degrading the performance thereof. Furthermore, when the conventional CMOS NOR gates are employed to build an address decoder or the like, the CMOS NOR gate will consume an alternating current power from the $V_{DD}$ power supply due to the current spike aforementioned. Since the frequency of the spike depends on the frequency of addresses sent by the CPU, the alternating current power consumed also depends on the frequency of address signals delivered from the CPU, which is constantly varied. Hence, the needed power budget, i.e., the necessary $V_{DD}$ power capacity, cannot be easily controlled.

SUMMARY OF THE INVENTION

The present invention employes a circuit analogous to a differential amplifier to form an MOS analog NOR amplifier which has at its inputs and outputs both a standard NOR gate logic function and a standard OR gate logic function, whereby a high speed MOS NOR gate, especially CMOS NOR gate, can be achieved without resorting to complicated and expensive bipolar technology.

The present invention also provides a CMOS analog NOR amplifier which is superior over the prior art CMOS NOR gate in that it does not generate current spikes, whereby a very low noise logic operation is achievable and the $V_{DD}$ power supply budget can be easily implemented.

The present invention also provides a MOS analog NOR amplifier which utilizes a low gain amplifier characteristic to obtain a low output inpedance, whereby the logic transient response can be very fast over the prior art.

The present invention further provides a constant current source which, in addition to a variety of usability in other situations, when in combination with the CMOS analog NOR amplifier will keep the Miller capacitance of the amplifier to be virtually zero, whereby the transient response of the CMOS analog NOR amplifier is further enhanced and a very high speed but low cost logic gate is obtainable.

Other merits and benefits of the present invention will become apparent as the following detailed description with reference to the accompanying drawings proceeds.

DESCRIPTION OF THE PREFERRED EMBODIMENTS

Figure 2:
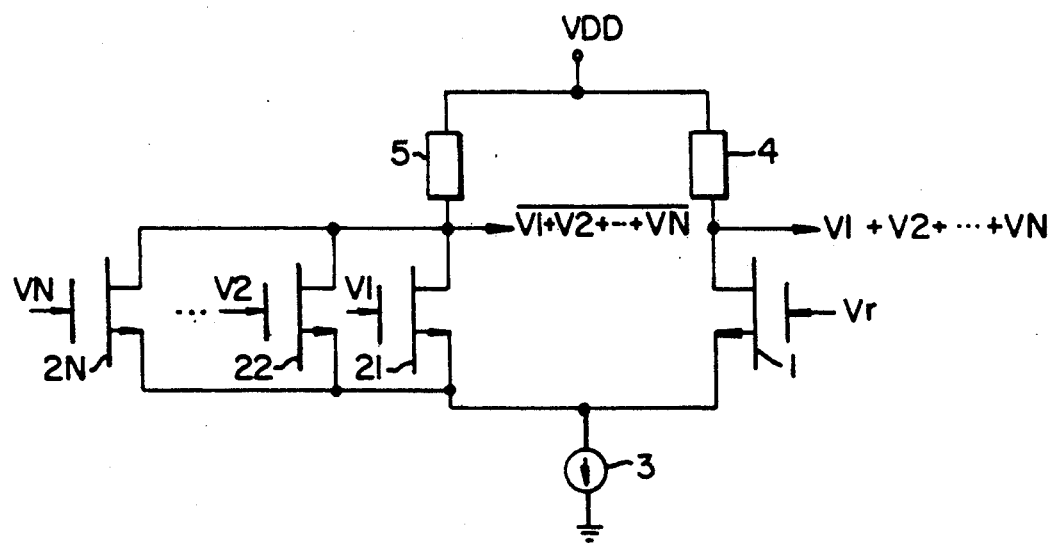
FIG. 2 is a diagram showing a CMOS analog NOR amplifier in accordance with the present invention.
Figure 1:
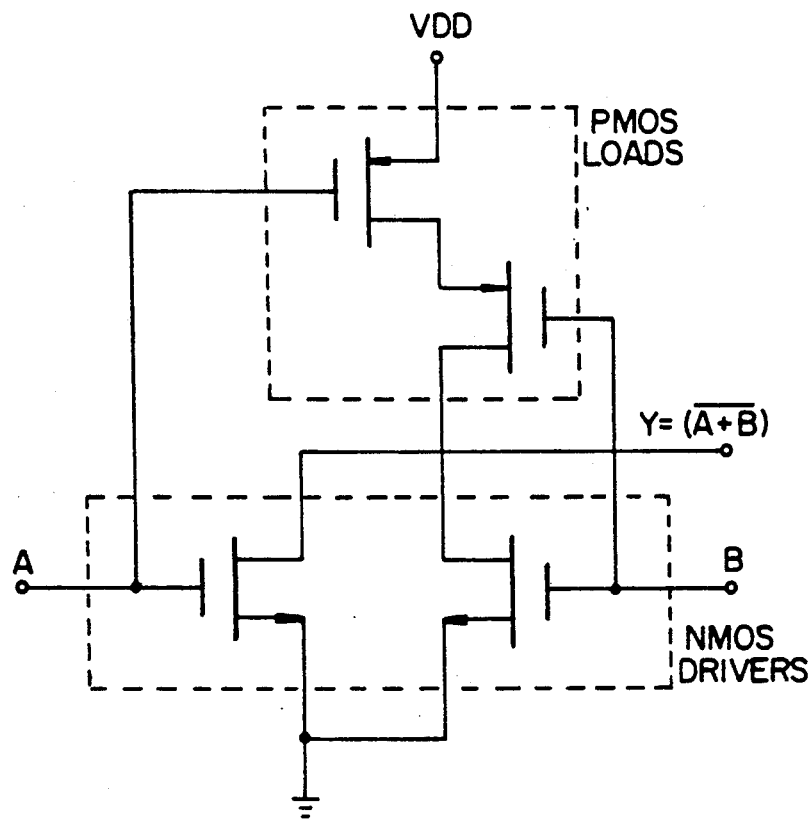
FIG. 1 is a diagram showing a conventional CMOS NOR gate.

Referring to FIG. 2, it can be seen that an embodiment of a CMOS analog NOR amplifier in accordance with the present invention is shown. A reference NMOS transistor has a source terminal connected to a constant current source 3, a gate terminal coupled to a reference voltage Vr, and a drain terminal attached to a first pull-up PMOS transistor 4. A plurality of input NMOS transistors 21, 22, ..., 2N, also have respective source terminals connected to one end of a constant current source 3, and drain terminals attached to a first terminal of respective second pull-up PMOS transistors 5. Each of the plurality of input NMOS transistors 21, 22, ..., 2N has a gate terminal to which input signals are applied. The NMOS transistors and PMOS transistors are thus formed of a CMOS logic gate. Another terminal of the first and second pull-up PMOS transistors are coupled respectively to a $V_{DD}$ voltage source while another end of the constant current source 3 is attached to ground.

The configuration and operation principle of the CMOS analog NOR amplifier is very similar to a differential amplifier. If an input $V_1, V_2, \ldots, V_N$ containing at least a signal whose voltage is higher than the reference voltage, representing a logic 1, is applied to the gates of the plurality of input NMOS transistors 21, 22, ..., 2N, the input NMOS transistor to which the logic 1 signal is applied will be conducted and kept in the saturation region of MOS characteristic curve and all other MOS transistors including the reference transistor 1 will be cut off. Thus, all the current from the constant current source 3 flows through the second pull-up PMOS transistor 5 and no current through the first pull-up PMOS transistor 4. Thus, the voltage at the drain terminal of the plurality of input MOS transistors will be $V_{DD} - I \times R$, where I is the current of the constant current source 3 and R is the resistance of the first or second pull-up PMOS transistor, and the voltage at the drain terminal of reference NMOS transistor 1 is $V_{DD}$. If all the inputs $V_1, V_2, \ldots, V_N$ are lowered than the reference voltage Vr, then all the current flows through the first pull-up PMOS transistor 4 and no current through the second pull-up PMOS transistor 5. Hence, the voltage at the drain terminal of the plurality of input NMOS transistors is $V_{DD}$ while the voltage at the drain terminal of the reference NMOS transistor is $V_{DD} - I \times R$. Therefore, a standard NOR gate operation is achieved with the output terminal at the drain terminal of the plurality of input NMOS transistors, and a standard OR gate operation is also available with the output terminal at the drain terminal of the reference NMOS transistor. The availability of providing an exactly complement signal is sometimes very important in certain applications, which aids in another merit of the present invention.

Figure 4:
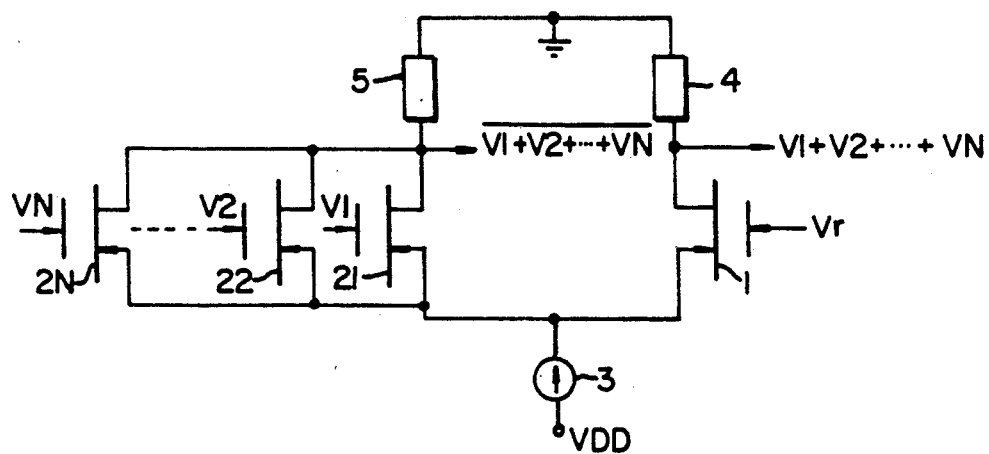
FIG. 4 is a diagram showing another CMOS analog NOR amplifier in accordance with the present invention.

Alternatively, the reference transistor 1 and the plurality of input transistors 21, 22, ..., 2N can be PMOS type, and the first and second pull-up transistors 4, 5 can be NMOS type. In this situation, the current direction of the constant current source 3 should be reversed and one end thereof is coupled to the $V_{DD}$ voltage source, while one end of first and second pull-up transistors should be grounded respectively, as shown in FIG. 4.

Another possibility is that the reference transistor 1 and the plurality of input transistors 21, 22, ..., 2N may be either NMOS type or PMOS type, and instead of using pull-up transistors, passive pull-up resistors or the like may be utilized. In this case, the thus formed logic gate will be either a NMOS analog NOR amplifier or a PMOS analog NOR amplifier.

The output voltage and input voltage swing is from $V_{DD}$ to ground in a conventional CMOS NOR gate. This large voltage swing will have a slow transient response when the output capacitance is large, because the transient response is proportional to a value equal to $R \times C$, where R is output impedance and C is output capacitance. If a differential amplifier has a very high gain, the transient characteristic will degrade greatly because of high output impedance. To perform logic functions, the high gain characteristic of an amplifier is not necessary. Gain of two is more than enough in the logic operation. For example, a 1 V input voltage swing producing a 2 V output voltage swing is adequate for a logic gate. Once the gain of an amplifier is greatly reduced, the output impedance will drop significantly and the transient characteristic will improve. Therefore, in the MOS NOR gate of the present invention the speed of transient response, i.e., from a logic 0 to a logic 1 or from a logic 1 to a logic 0, can be greatly enhanced over that in a conventional NOR gate.

Another important technique of the MOS analog NOR amplifier of the present invention is to reduce the Miller capacitance effect of the amplifier. As is well known, in an MOS transistor amplifier the effective capacitance between the drain terminal and gate terminal will be about the physical capacitance between the same multiplied by the gain of the amplifier, which is called "Miller capacitance". As mentioned earlier, the transient response characteristic is directly proportional to $R \times C$, where R is the output impedance and C represents the output capacitance. To speed the operation of the NOR amplifier, the Miller capacitance should be reduced as much as possible. It is known that if the voltage difference between the drain terminal with respect to the gate terminal is kept reverse biased, than Miller capacitance thereof will be nearly zero. To speak more accurately, it is desired that the voltage difference between the drain terminal with respect to the gate terminal be always maintained below a drain-to-gate threshold voltage Vt of the MOSFET transistor to reduce the Miller capacitance and improve the transient response.

Figure 3:
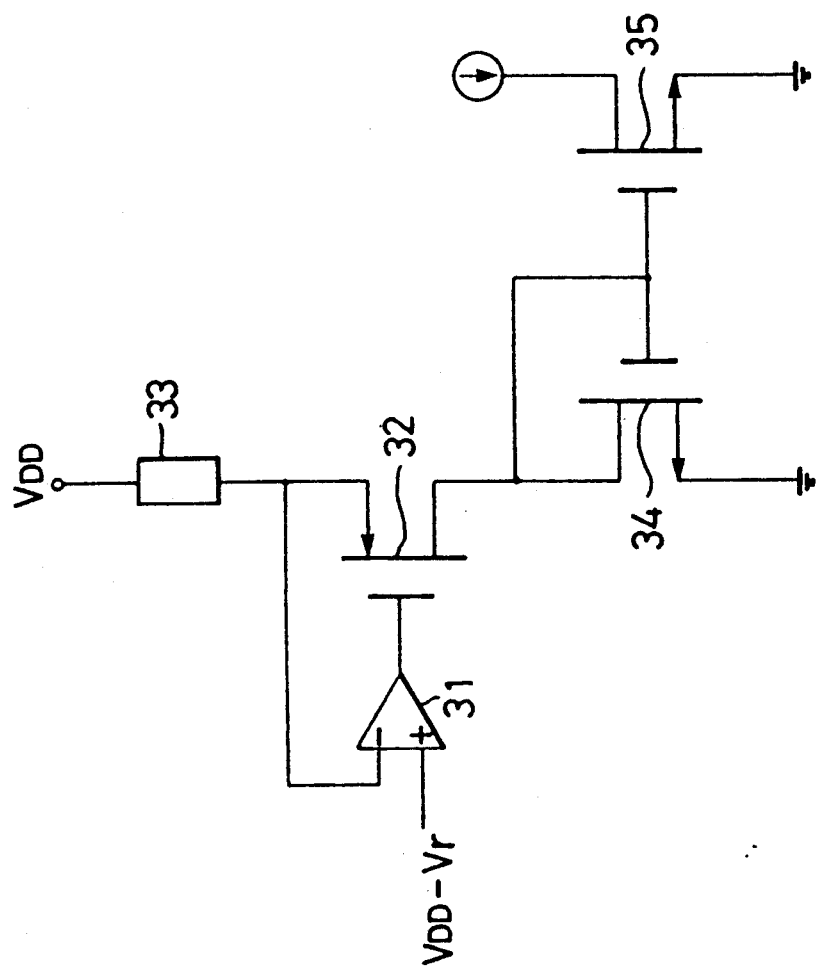
FIG. 3 is a diagram showing a CMOS constant current source in accordance with the present invention.

FIG. 3 shows a proposed constant current source 3 employed in the present invention which will keep the drain-gate voltage of the plurality of input transistors 21, 22, ..., 2N to be below the threshold voltage Vt.

The constant current source 3 comprises a operational amplifier 31 which has a "+" input terminal connected to a constant voltage $V_{DD} - V_r$ in this case, a "−" input terminal coupled to a source terminal of a PMOS transistor 32 and an output terminal attached to a gate terminal of the PMOS transistor 32. The source terminal of the PMOS transistor 32 is also coupled to a match pull-up PMOS transistor 33 which is exactly the same as the first and second pull-up PMOS transistors 4, 5 in every respect and one end of which is connected to the $V_{DD}$ voltage source, and a drain terminal of the same is attached to a drain terminal of a first NMOS transistor 34 whose gate terminal is connected together with the drain terminal thereof and source terminal grounded. The gate terminal of the first NMOS transistor 34 is connected to the gate terminal of a second NMOS transistor 35 whose source terminal is grounded.

The first NMOS transistor 34 and second NMOS transistor 35 constitutes a "current mirror", which means the current flowing through the drain terminal of the first NMOS transistor will appear in the drain terminal of the second NMOS transistor. Since the "+" input terminal and "−" input terminal of the operational amplifier 31 are virtually shorted, the source terminal of the PMOS transistor 32 is equal to $V_{DD} - V_r$. On the account that the impedance of the match pull-up PMOS transistor 33 is exactly the same as that of the first and second pull-up PMOS transistors 4, 5 regardless of the temperature variations, manufacturing processing, etc., with the constant current source 3 employed in the CMOS analog NOR amplifier the drain terminal of the plurality of input NMOS transistors 21, 22, ..., 2N will be kept at $V_{DD}$'Vr which represents a logic 0 if at least one of the gate terminals of the input NMOS transistors is input a logic 1 and the constant current flows through the second pull-up PMOS transistor 5. Of course, if all the inputs of the plurality of input NMOS transistors is at logic 0, no current flows through the second pull-up PMOS transistor 5 and the voltage at the drain terminal of the plurality of input NMOS transistor is $V_{DD}$ which represents a logic 1.

Now it should be very clear that if the highest voltage, i.e., logic 1, at the input terminal is kept below $V_{DD} - V_r + V_T$, where $V_T$ is the threshold voltage between the drain terminal and the gate terminal of the MOSFET transistor, than the Miller capacitance of the plurality of input NMOS transistors will be maintained nearly zero, the transient response is greatly enhanced and a high speed NOR gate is achieved. The voltage level difference between the output terminal and the input terminal can be resolved by a voltage shifter. Alternatively, a plurality of the MOS analog NOR amplifiers of the present invention can be cascaded together providing a desired Boolean expression result, whereby after the second stage of the cascaded MOS analog NOR amplifiers the voltage level of logic 1 or logic 0 between the input and output terminal can be the same, which will be a design choice.

Figure 5:
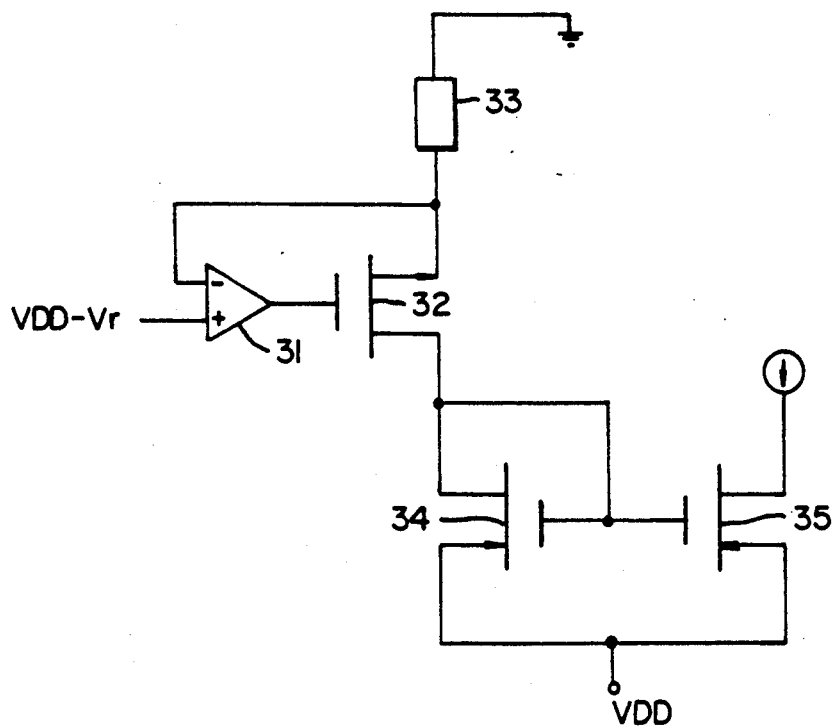
FIG. 5 is a diagram showing another CMOS constant current source in accordance with the present invention.

It should be noticed that if PMOS type of reference and input transistors and NMOS type of first and second pull-up transistors are adopted, then the MOS transistor type in the constant current source should be reversed, as shown in FIG. 5, i.e., NMOS type is changed to PMOS type and vice versa, and the corresponding ends coupled to the $V_{DD}$ voltage source or ground in the constant current source should be changed to attach to the ground or $V_{DD}$ voltage source respectively.

It is to be understood that the above depicted technical idea of configurating an MOS transistor differential amplifier to perform logic operations can be employed to form a NAND gate or other logic gates, and these are intended to be covered within the scope of the present invention.

While the invention has been explained in relation to its preferred embodiments, it is to be understood that various modifications thereof will become apparent to those skilled in the art upon reading this specification. Therefore, it is to be understood that the invention disclosed herein is intended to cover such modifications as fall within the scope of the appended claims.

What is claimed is:

1. An MOS analog NOR amplifier comprising:
   a constant current source;
   a reference MOS transistor having a source, a gate and a drain terminal, wherein the source terminal of said reference MOS transistor is connected to a first terminal of said constant current source, said gate terminal is connected to a constant reference voltage and said drain terminal is connected to a first terminal of a first pull-up means; and
   a plurality of input MOS transistors each of which has a source, a gate and a drain terminal, wherein the source terminal of each of said input MOS transistors is connected to said first terminal of said constant current source and the drain terminal of the same is connected to a first terminal of a second pull-up means;
   wherein in response to a logic "1" or a logic "0" signal applied at the gate terminal of each of said input MOS transistors, an output signal is generated at the drain terminals of said plurality of input MOS transistors which is the same response as that of a standard NOR gate and an output signal is generated at the drain terminal of said reference MOS transistor which is the same response as that of a standard OR gate; and
   wherein said reference MOS transistor and said plurality of input MOS transistors are NMOS transistors, and said first and second pull-up means are PMOS transistors with respective second terminals thereof being coupled to a $V_{DD}$ source; and
   wherein a second terminal of said constant current source is connected to ground.

2. The MOS analog NOR amplifier as recited in claim 1, wherein said first and second PMOS transistor pull-up means are identical in every aspect and wherein said constant current source comprises:
   an operational amplifier having a "+" and a "−" input terminals and an output terminal, the "+" input terminal thereof being connected to a voltage source;
   a PMOS match pull-up transistor which is identical to said first and second PMOS transistor pull-up means in every aspect, and one end of which is connected to a $V_{DD}$ source and another end of which is attached to the "−" input terminal of said operational amplifier;
   a PMOS transistor having a gate terminal thereof connected to the output terminal of said operational amplifier and a source terminal thereof coupled to the "−" input terminal of said operational amplifier;
   a first NMOS transistor having a source terminal thereof grounded and a drain terminal thereof connected to the drain terminal of said PMOS transistor, a gate terminal thereof being attached together with the drain terminal of the same;
   a second NMOS transistor having a source terminal thereof grounded and a gate terminal thereof coupled to the gate terminal of said first NMOS transistor;
   wherein the $V_{DD}$ source, the voltage source attached to the "+" input terminal of said operational amplifier and an impedance of said PMOS match pull-up transistor define a constant current flowing through a drain terminal of said second NMOS transistor.

3. An MOS analog NOR amplifier comprising:
   a constant current source;
   a reference MOS transistor having a source, a gate and a drain terminal, wherein the source terminal of said reference MOS transistor is connected to a first terminal of said constant current source, said gate terminal is connected to a constant reference voltage and said drain terminal is connected to a first terminal of a first pull-up means; and
   a plurality of input MOS transistors each of which has a source, a gate and a drain terminal, wherein the source terminal of each of said input MOS transistors is connected to said first terminal of said constant current source and the drain terminal of the same is attached to a first terminal of a second pull-up means;
   wherein in response to a logic "1" or a logic "0" signal applied at the gate terminal of each of said input MOS transistors, an output signal is generated at the drain terminals of said plurality of input MOS transistors which is the same response as that of a standard NOR gate and an output signal is generated at the drain terminal of said reference MOS transistor which is the same response as that of a standard OR gate; and
   wherein said reference MOS transistor and said plurality of input MOS transistors are PMOS transistors, and said first and second pull-up means are NMOS transistors with respective second terminals thereof being grounded; and wherein a second terminal of said constant current source is connected to a $V_{DD}$ source.

4. The MOs analog NOR amplifier as recited in claim 3, wherein said first and second NMOS transistor pull-up means are identical in every aspect and wherein said constant current source comprises:

an operational amplifier having a "+" and a "−" input terminals and an output terminal, the "+" input terminal thereof being connected to a voltage source;

an NMOS match pull-up transistor which is identical to said first and second NMOS transistor pull-up means in every aspect, and one end of which is grounded and another end of which is attached to the "−" input terminal of said operational amplifier;

an NMOS transistor having a gate terminal thereof connected to the output terminal of said operational amplifier and a source terminal thereof coupled to the "−" input terminal of said operational amplifier;

a first PMOS transistor having a source terminal thereof connected to a $V_{DD}$ source and a drain terminal thereof coupled to the drain terminal of said NMOS transistor, a gate terminal thereof being attached together with the drain terminal of the same;

a second PMOS transistor having a source terminal thereof connected to the $V_{DD}$ source and a gate terminal thereof coupled to the gate terminal of said first PMOS transistor;

wherein the $V_{DD}$ source, the voltage source attached to the "+" input terminal of said operational amplifier and an impendance of said NMOS match pull-up transistor define a constant current flowing through a drain terminal of said second PMOS transistor.

5. A CMOS constant current source comprising;

an operational amplifier having a "+" and a "−" input terminals and an output terminals, the "+" input terminal thereof being connected to a voltage source;

pull-up means, one end of which is connected to a $V_{DD}$ source and another end of which is attached to the "−" input terminal of said operational amplifier;

a PMOS transistor having a gate terminal thereof connected to the output terminal of said operational amplifier and a source terminal thereof coupled to the "−" input terminal of said operational amplifier;

a first NMOS transistor having a source terminal thereof grounded and a drain terminal thereof connected to the drain terminal of said PMOS transistor, a gate terminal thereof being attached together with the drain terminal of the same;

a second NMOS transistor having a source terminal thereof grounded and a gate terminal thereof coupled to the gate terminal of said first NMOS transistor;

said CMOS constant current source being formed such that a constant current will flow through a drain terminal of said second NMOS transistor, which is only determined by the $V_{DD}$ source, the voltage source attached to the "+" input terminal of said operational amplifier and an impedance of said pull-up means.

6. The CMOS constant current source as recited in claim 5, wherein said pull-up means is composed of a PMOS transistor.

7. The CMOS constant current source as recited in claim 5, wherein said pull-up means is a pull-up resistor.

8. A CMOS constant current source comprising:

an operational amplifier having a "+" and a "−" input terminals and an output terminals, the "+" input terminal thereof being connected to a voltage source;

pull-up means, one end of which is grounded and another end of which is attached to the "−" input terminal of said operational amplifier;

an NMOS transistor having a gate terminal thereof connected to the output terminal of said operational amplifier and a source terminal thereof coupled to the "−" input terminal of said operational amplifier;

a first PMOS transistor having a source terminal thereof connected to a $V_{DD}$ source and a drain terminal thereof coupled to the drain terminal of said NMOS transistor, a gate terminal thereof being attached together with the drain terminal of the same;

a second PMOS transistor having a source terminal thereof connected to the $V_{DD}$ source and a gate terminal thereof coupled to the gate terminal of said first PMOS transistor;

said CMOS constant current source being formed such that a constant current will flow through a drain terminal of said second PMOS transistor, which is only determined by the $V_{DD}$ source, the voltage source attached to the "+" input terminal of said operational amplifier and an impedance of said pull-up means.

9. The CMOS constant current source as recited in claim 8, wherein said pull-up means is composed of an NMOS transistor.

10. The CMOS constant current source as recited in claim 8, wherein said pull-up means is a pull-up resistor.

* * * * *